US010139850B2

(12) United States Patent
Pasotti et al.

(10) Patent No.: US 10,139,850 B2
(45) Date of Patent: Nov. 27, 2018

(54) ANALOG BOOST CIRCUIT FOR FAST RECOVERY OF MIRRORED CURRENT

(71) Applicant: STMicroelectronics S.r.l., Agrate Brianza (IT)

(72) Inventors: Marco Pasotti, Travaco' Sicomario (IT); Laura Capecchi, Vedano Al Lambro (IT); Riccardo Zurla, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/887,323

(22) Filed: Feb. 2, 2018

(65) Prior Publication Data

US 2018/0188763 A1 Jul. 5, 2018

Related U.S. Application Data

(63) Continuation of application No. 15/397,137, filed on Jan. 3, 2017, now Pat. No. 9,921,598.

(51) Int. Cl.
*G11C 7/00* (2006.01)
*G05F 3/26* (2006.01)

(52) U.S. Cl.
CPC ..................................... *G05F 3/26* (2013.01)

(58) Field of Classification Search
CPC . G11C 13/004; G11C 7/04; G11C 2013/0054; G05F 3/267
USPC .............. 365/185.2, 185.21, 185.22, 185.15, 365/210.15, 218, 18.18; 323/207, 266, 323/267, 311–316
See application file for complete search history.

(56) References Cited

U.S. PATENT DOCUMENTS

| | | | | |
|---|---|---|---|---|
| 5,175,533 | A | 12/1992 | Krenik | |
| 6,072,259 | A | 6/2000 | Kawabata et al. | |
| 6,535,429 | B2 | 3/2003 | Conte et al. | |
| 7,075,841 | B2 * | 7/2006 | Resta | G11C 13/0004 365/189.16 |
| 7,782,695 | B2 * | 8/2010 | Bedarida | G11C 7/02 365/185.2 |
| 8,264,872 | B2 | 9/2012 | De Sandre et al. | |
| 9,312,009 | B2 * | 4/2016 | Lai | G11C 16/08 |
| 2010/0020594 | A1 * | 1/2010 | De Sandre | G11C 13/0004 365/163 |

* cited by examiner

*Primary Examiner* — Rajnikant Patel
(74) *Attorney, Agent, or Firm* — Crowe & Dunlevy

(57) ABSTRACT

A current mirror includes an input transistor and an output transistor, wherein the sources of the input and output transistor are connected to a supply voltage node. The gates of the input and output transistors are connected through a switch. A first current source is coupled to the input transistor to provide an input current. A copy transistor has a source connected to the supply node and a gate connected to the gate of the input transistor at a mirror node. A second current source is coupled to the copy transistor to provide a copy current. A source-follower transistor has its source connected to the mirror node and its gate connected to the drain of the copy transistor. Charge sharing at the mirror node occurs in response to actuation of the switch and the source-follower transistor is turned on in response thereto to discharge the mirror node.

10 Claims, 5 Drawing Sheets

ANALOG BOOST CIRCUIT FOR FAST RECOVERY OF MIRRORED CURRENT

CROSS REFERENCE TO RELATED APPLICATION

This application is a continuation of U.S. patent application Ser. No. 15/397,137 filed Jan. 3, 2017, the disclosure of which is incorporated by reference.

TECHNICAL FIELD

The present invention relates to current mirroring circuits and, in particular, to an analog boost circuit configured to provide for fast recovery of mirrored current.

BACKGROUND

Current mirroring circuits are well known in the art. These circuits operate to mirror an input reference current to an output current. The ratio of the magnitude of the output current to the input current is referred to as the mirroring ratio. Some current mirror implementations switch on the output transistor providing the output current. Due to the time delay associated with charging the gate capacitance of the output transistor, there is a time delay in the output current reaching peak magnitude. This "settling time" for the output current can introduce problems with the operation of downstream circuitry supplied with a signal output from the current mirror.

There is a need in the art to address the foregoing problem.

SUMMARY OF THE INVENTION

It is to be understood that both the foregoing general description and the following detailed description are exemplary and explanatory and are intended to provide further explanation of the invention as claimed.

In an embodiment, a current mirroring circuit comprises: an input leg including a first transistor having a source node, a gate node and a drain node, wherein said source node is coupled to a supply voltage node, and said gate node is coupled to said drain node; an output leg including a second transistor having a source node, a gate node and a drain node, wherein said source node is coupled to the supply voltage node; a first switch coupling the gate node of the second transistor to the gate node of the first transistor; a copy leg including a third transistor having a source node, a gate node and a drain node, wherein said source node is coupled to the supply voltage node and said gate node is directly connected to the gate node of the first transistor; and a source-follower transistor having a source node, a gate node and a drain node, wherein said source node is directly connected to the connected gate nodes of the first and third transistors and said gate node is coupled to the drain node of the third transistor.

In an embodiment, a current mirroring circuit comprises: first transistor having a source node, a gate node and a drain node, wherein said source node is connected to a supply voltage node, and said gate node is connected to said drain node; a second transistor having a source node, a gate node and a drain node, wherein said source node is connected to the supply voltage node; a first switch coupling the gate node of the second transistor to the gate node of the first transistor; a third transistor having a source node, a gate node and a drain node, wherein said source node is connected to the supply voltage node and said gate node is connected to the gate node of the first transistor; and a source-follower transistor having a source node, a gate node and a drain node, wherein said source node is connected to the connected gate nodes of the first and third transistors and said gate node is connected to the drain node of the third transistor.

In an embodiment, a current mirror circuit comprises: an input transistor; an output transistor; wherein sources of the input and output transistor are connected to a supply voltage node; a switch coupling a gate of the input transistor to a gate of the output transistor; a first current source coupled to provide an input current to the input transistor; a copy transistor having a source connected to the supply node and a gate connected to the gate of the input transistor at a mirror node; a second current source coupled to provide a copy current to the copy transistor; a source-follower transistor having a source connected to the mirror node and a gate coupled to a drain of the copy transistor; and a control circuit configured to actuate said switch resulting in charge sharing to occur between the gate of the output transistor and the mirror node, said source-follower transistor being turned on in response to said charge sharing so as to discharge the mirror node.

In an embodiment, a method comprises: mirroring an input current in an input circuit leg to an output current in an output circuit leg; selectively actuating the output circuit leg; prior to said selectively actuating, generating a copy current in a copy circuit leg that is mirrored with the input current in the input circuit leg; and after selectively actuating, responding to a decrease in magnitude of the copy current due to charge sharing at a common mirror node of the input circuit leg, output circuit leg and copy circuit leg by generating a response current which discharges said common mirror node.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
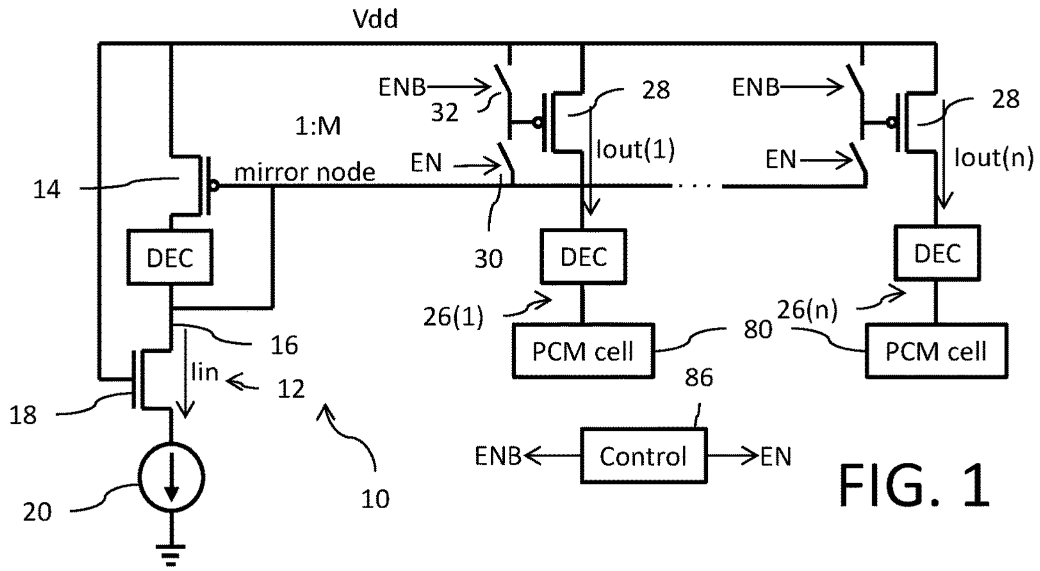
FIG. 1 is a circuit diagram of a current mirroring circuit.

Reference is now made to FIG. 1 showing a circuit diagram of a current mirroring circuit 10. The circuit 10 includes an input leg 12 formed by a first p-channel transistor 14 having a source node, a gate node and a drain node. The source node is coupled to a supply voltage node Vdd and the gate node (also referred to herein as the mirror node) is coupled to the drain node at an intermediate node 16. The first p-channel transistor 14 is accordingly a diode-connected device. An n-channel transistor 18 in the input leg has a source node, a gate node and a drain node, and the source-drain paths of transistors 14 and 18 are coupled in series. The drain node of transistor 18 is coupled to the intermediate node and the gate node is coupled the supply voltage node Vdd. The transistor 18 is accordingly turned-on when power is supplied to the circuit. A current source 20 is coupled between the source node of transistor 18 and a ground reference node, and thus is coupled in series with the series coupled source-drain paths of transistors 14 and 18. The current source 20 sinks an input current Iin from the gate (mirror) node of transistor 14, with that input current Iin flowing in the input leg 12.

The circuit 10 further includes a plurality of output legs 26(1)-26(*n*). Each output leg 26 is formed by a second p-channel transistor 28 having a source node, a gate node and a drain node. The source node is coupled to the supply voltage node Vdd and the gate node is connected to the gate (mirror) node of the transistor 14 through a first switch circuit 30. The first switch circuit 30 is actuated to a closed state in response to an enable signal EN in order to enable the current mirroring operation with the drain node of transistor 28 in each output leg 26(1)-26(*n*) outputting an output current Iout (Iout(1) . . . Iout(n)) that mirrors the input current Iin, where Iout=M*Iin with M equal to the mirroring ratio between the p-channel transistor 14 and the p-channel transistor 28 that is defined by the difference in transistor size (width/length). The gate node of the transistor 28 is further connected to the supply voltage node Vdd through a second switch 32. The second switch 32 is actuated to a closed state in response to an enable bar signal ENB (that is the logical complement of the signal EN) in order to charge the gate nodes to the supply voltage Vdd and accordingly ensure that the transistors 28 are fully turned off.

A control circuit 86 is provided to generate the enable signal EN and the enable bar signal ENB so as to control operation of the current mirroring circuit 10 with respect to the disabled mode of operation when the enable bar signal ENB is asserted and the enabled mode of operation when the enable signal EN is asserted.

Figure 2A:
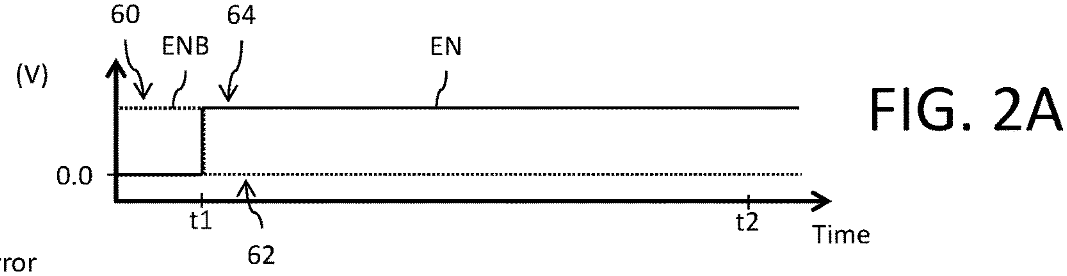
FIGS. 2A-2C show operational waveforms for the current mirroring circuit of FIG. 1.
Figure 2B:
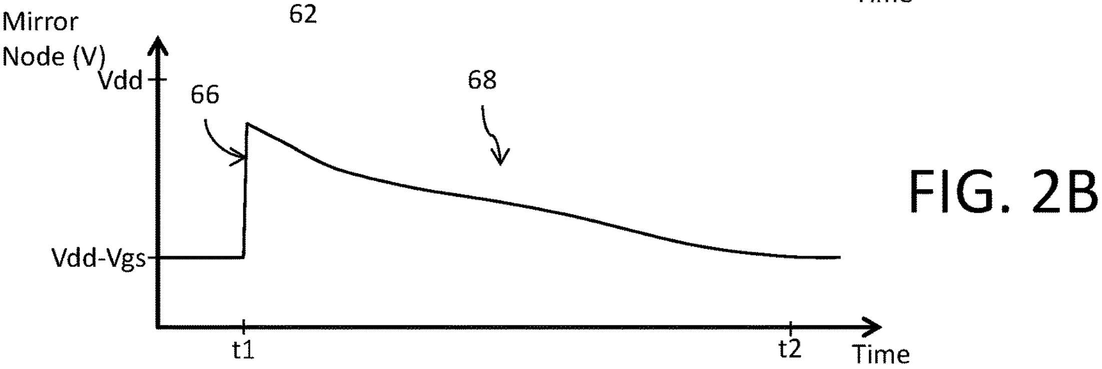
Figure 2C:
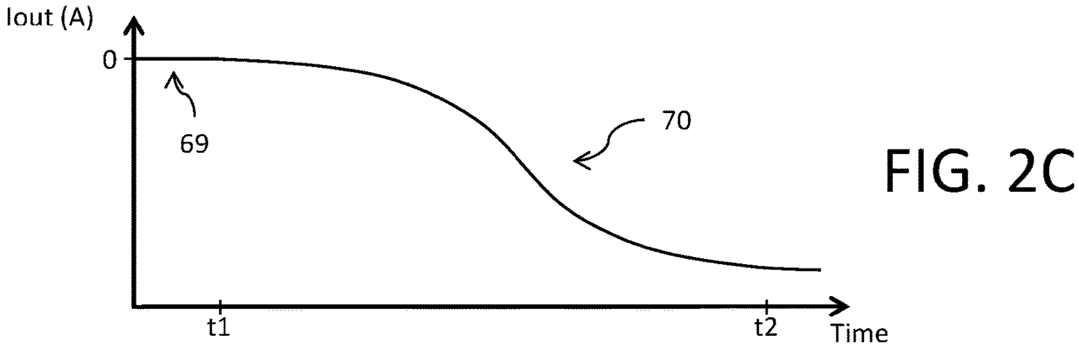

With reference to FIGS. 2A-2C, operation of the circuit 10 is as follows:

Prior to time t1, the control circuit 86 causes the enable bar signal ENB to be asserted (reference 60) to turn on the second switches 32 associated with the transistors 28 in the output legs 26(1)-26(*n*). This couples the gate terminals of transistors 28 to the supply voltage node Vdd which results in a charging of the gate capacitance to the voltage Vdd. This fully turns off the transistors 28 and thus there is zero output current Iout (reference 69) in the output legs 26(1)-26(*n*). Because the enable signal EN is correspondingly deasserted by the control circuit 86, the gate terminals of transistors 28 are disconnected from the gate (mirror) node of transistor 14. The voltage at the gate (mirror) node of transistor 14 will be at approximately one gate to source voltage drop (Vgs about 0.8V) for transistor 14 below the supply voltage Vdd.

At time t1, the enable bar signal ENB is deasserted (reference 62) by the control circuit 86 to turn off the second switches 32 and the enable signal EN is correspondingly asserted (reference 64) by the control circuit 86 to turn on the first switches 30 and connect the gate terminals of transistors 28 to the gate (mirror) node of transistor 14. Because of charge sharing, the voltage at the gate (mirror) node of transistor 14 will immediately rise (reference 66) and then slowly fall back (reference 68) toward the pre-time t1 voltage as the gate (mirror) node of transistor 14 is discharged by the input current Iin. As the voltage at the gate (mirror) node of transistor 14 falls, the transistors 28 in the output legs 26(1)-26(*n*) become more conductive and the magnitude of the output current Iout in the output legs 26(1)-26(*n*) correspondingly increases (reference 70). It will be noted that there is a significant delay between time t1 and time t2 when the peak magnitude of the output current Iout is reached. This “settling time” for the gate (mirror) node voltage between t1 and t2 is proportional to the capacitive load presented by the gate capacitances of the transistors 28 in the output legs 26(1)-26(*n*). If the output current Iout is being supplied in connection with the generation of a current pulse, the leading edge of that current pulse will not exhibit a short and sharp transition profile. In some current driven applications, such as with respect to the resetting of phase-change memory (PCM) cells 80 coupled to the output legs 26(1)-26(*n*), such a current pulse may be ineffective to achieve the desired operation. It will be noted that in connection with the use of the current mirror circuit 10 in such a memory application, a column decoding circuit (DEC) may be included in the input leg 12 and/or the output legs 26.

Figure 3:
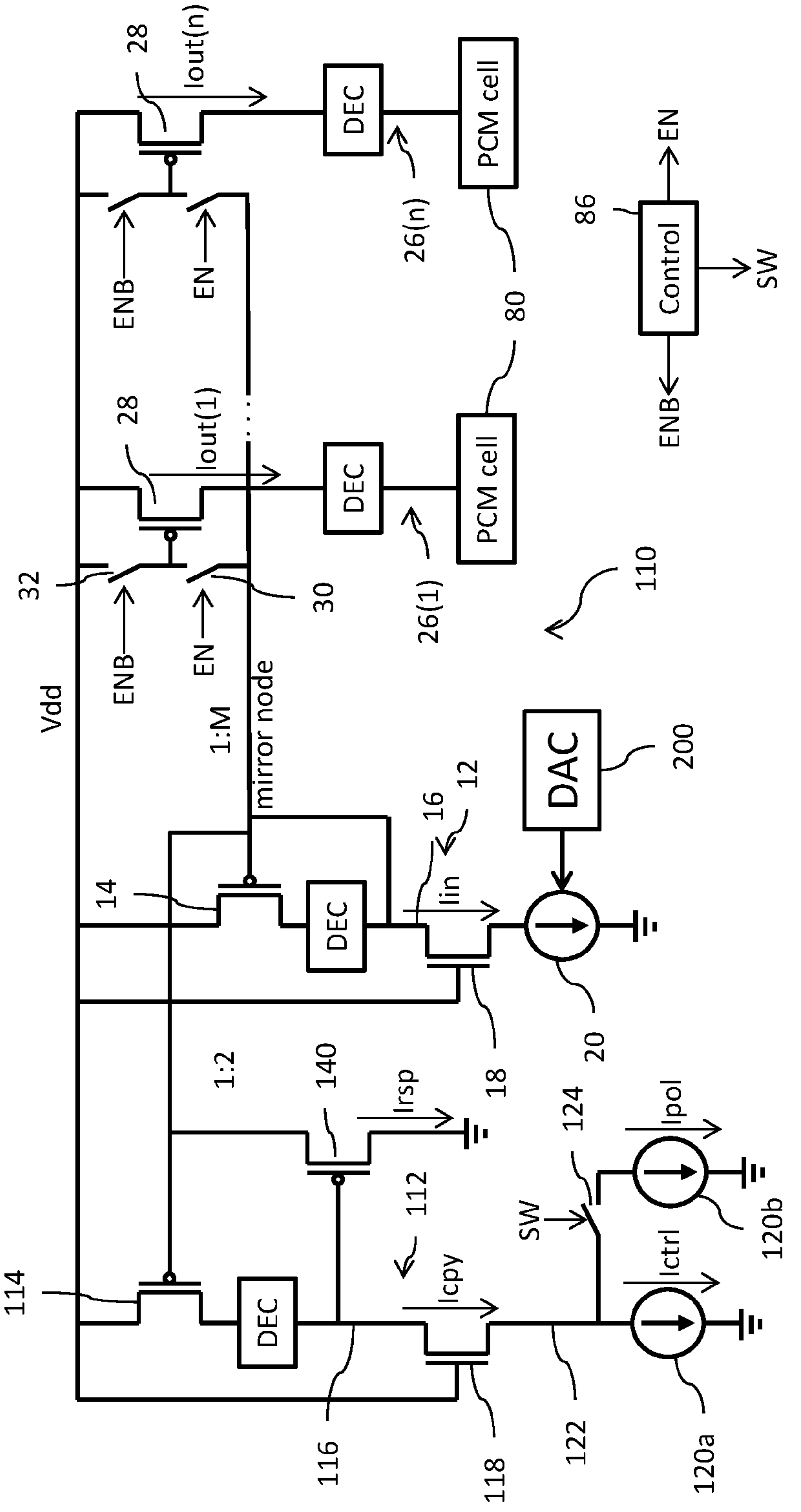
FIG. 3 is a circuit diagram of a current mirroring circuit.

Reference is now made to FIG. 3 showing a circuit diagram of a current mirroring circuit 110. The circuit 110 includes an input leg 12 formed by a first p-channel transistor 14 having a source node, a gate node and a drain node. The source node is coupled to a supply voltage node Vdd and the gate node (also referred to herein as the mirror node) is coupled to the drain node at an intermediate node 16. The first p-channel transistor 14 is accordingly a diode-connected device. An n-channel transistor 18 in the input leg has a source node, a gate node and a drain node, and the source-drain paths of transistors 14 and 18 are coupled in series. The drain node of transistor 18 is coupled to the intermediate node 16 and the gate node is coupled the supply voltage node Vdd. The transistor 18 is accordingly turned-on when power is supplied to the circuit. A current source 20 is coupled between the source node of transistor 18 and a ground reference node, and thus is coupled in series with the series coupled source-drain paths of transistors 14 and 18. The current source 20 sinks an input current Iin from the gate (mirror) node of transistor 14, with that input current Iin flowing in the input leg 12.

The circuit 110 further includes a plurality of output legs 26(1)-26(*n*). Each output leg 26 is formed by a second p-channel transistor 28 having a source node, a gate node and a drain node. The source node is coupled to the supply voltage node Vdd and the gate node is connected to the gate (mirror) node of the transistor 14 through a first switch circuit 30. The first switch circuit 30 is actuated to a closed state in response to an enable signal EN in order to enable the current mirroring operation with the drain node of transistor 28 in each output leg 26(1)-26(*n*) outputting an output current Iout (Iout(1) . . . Iout(n)) that mirrors the input current Iin, where Iout=M*Iin with M equal to the mirroring ratio between the p-channel transistor 14 and the p-channel transistor 28 that is defined by the difference in transistor size (width/length). The gate node of the transistor 28 is further connected to the supply voltage node Vdd through a second switch 32. The second switch 32 is actuated to a closed state in response to an enable bar signal ENB (that is the logical complement of the signal EN) in order to charge the gate nodes to the supply voltage Vdd and accordingly ensure that the transistors 28 are fully turned off.

The circuit 110 still further includes a copy leg 112 formed by a third p-channel transistor 114 having a source node, a gate node and a drain node. The source node is coupled to a supply voltage node Vdd, the drain node is coupled to an intermediate node 116 and the gate node is coupled to the gate (mirror) node of transistor 14. The mirroring ratio between the p-channel transistor 14 and the p-channel transistor 114 is selected to meet power consumption specification (in an example, the ratio may be 2:1). An n-channel transistor 118 in the copy leg 112 has a source node, a gate node and a drain node, and the source-drain paths of transistors 114 and 118 are coupled in series. The drain node of transistor 118 is coupled to the intermediate node 116, the source node is coupled to intermediate node 122 and the gate node is coupled the supply voltage node Vdd. The transistor 118 is accordingly turned-on when power is supplied to the circuit. A control current source 120*a* is coupled between the intermediate node 122 and the ground reference node, and thus is coupled in series with the series coupled source-drain paths of transistors 114 and 118. The control current source 120*a* sinks a control current Ictrl from the intermediate node 122. A polarization current source 120*b* is coupled through a third switch 124 between the intermediate node 122 and the ground reference node, and is thus coupled in parallel with the current source 120*a*. The polarization current source 120*b* selectively sinks a polarization current Ipol from the intermediate node 122 depending on the actuation state of the third switch 124. The third switch 124 is actuated to a closed state in response to a switch control signal SW. A copy current Icpy flows through the source-drain path of transistors 114 and 118, with Icpy=Ictrl+Ipol when the third switch 124 is actuated to the closed state and Icpy=Ictrl otherwise. The control current source 120*a* is configured such that the magnitude of the control current Ictrl is proportional to the input current Iin. In an embodiment, Ictrl=0.4*Iin. The polarization current source 120*b* is configured such that the magnitude of the polarization current Ipol is a fraction of the input current Iin. In an embodiment, Ipol=0.15*Iin. Thus, the magnitude of the copy current Icpy when the third switch 124 is actuated is Icpy=0.55*Iin).

The circuit 110 further includes a fourth p-channel transistor 140 having a source node, a gate node and a drain node. The source node is coupled to the gate (mirror) node of transistor 14, the drain node is coupled to the ground reference node and the gate node is coupled to the intermediate node 116. The transistor 140 is thus configured as a source-follower transistor.

A control circuit 86 is provided to generate the enable signal EN and the enable bar signal ENB so as to control operation of the current mirroring circuit 110 with respect to the disabled mode of operation when the enable bar signal ENB is asserted and the enabled mode of operation when the enable signal EN is asserted. The control circuit 86 further generates the switch signal SW to control operation of the current mirroring circuit 110 with respect to the analog boost mode of operation which includes a mode where the switch signal SW is asserted and the enable signal EN is deasserted and a further mode where the switch signal SW is deasserted and the enable signal EN is asserted. The relative timing between assertions and deassertions of the signals is controlled by the control circuit 86.

With reference to FIGS. 4A-4E, operation of the circuit 110 is as follows:

Prior to time t1, the enable bar signal ENB is asserted (reference 60) by the control circuit 86 to turn on the second switches 32 associated with the transistors 28 in the output legs 26(1)-26(*n*). This couples the gate terminals of transistors 28 to the supply voltage node Vdd which results in a charging of the gate capacitance to the voltage Vdd. This fully turns off the transistors 28 and thus there is zero output current Iout (reference 69) in the output legs 26(1)-26(*n*). Because the enable signal EN is correspondingly deasserted by the control circuit 86, the gate terminals of transistors 28 are disconnected from the gate (mirror) node of transistor 14. The voltage at the gate (mirror) node of transistor 14 will be at approximately one gate to source voltage drop (Vgs about 0.8V) for transistor 14 below the supply voltage Vdd. Additionally, the switch signal SW is asserted (reference 160) by control circuit 86 to turn on third switch 124. The copy current Icpy=0.55*Iin in this configuration. Thus, a non-zero response current Irsp in the source-drain path of source-follower transistor 140 sinks current (reference 164) from the gate (mirror) node of transistor 14 (with a magnitude, for example, equal to Irsp=0.05Iin).

At time t1, the switch signal SW is deasserted (reference 162) by the control circuit 86 so that the polarization current Ipol no longer contributes to the copy current Icpy, the enable bar signal ENB is deasserted (reference 62) by the control circuit 86 to turn off the second switches 32 and the enable signal EN is correspondingly asserted (reference 64) by the control circuit 86 to turn on switches 30 and connect the gate terminals of transistors 28 to the gate (mirror) node of transistor 14.

Figure 4A:
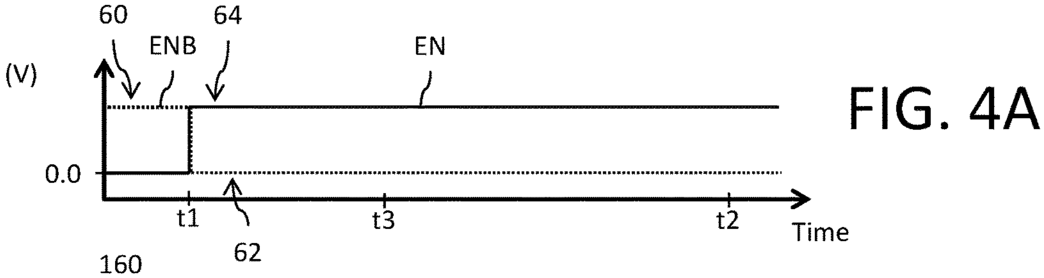
FIGS. 4A-4E show operational waveforms for the current mirroring circuit of FIG. 3.
Figure 4B:
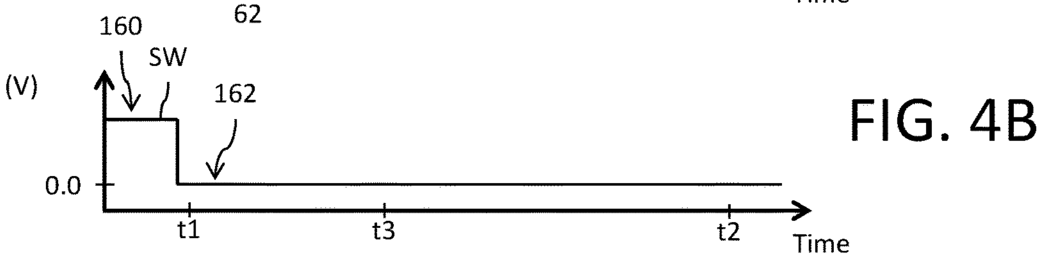
Figure 4C:
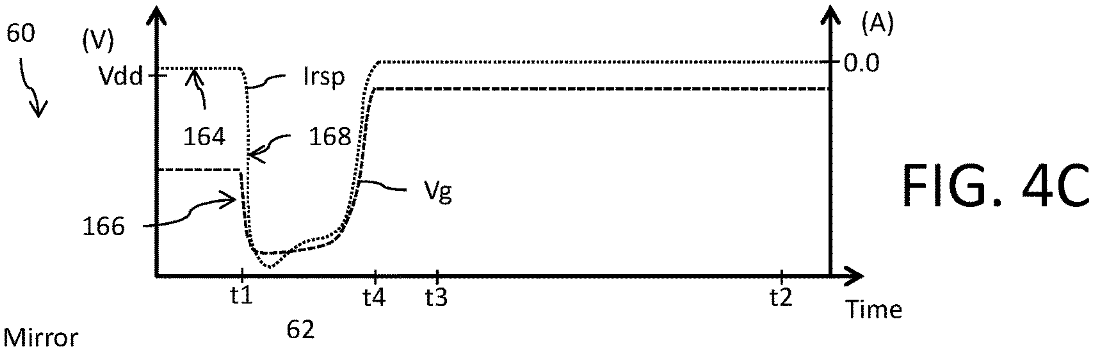
Figure 4D:
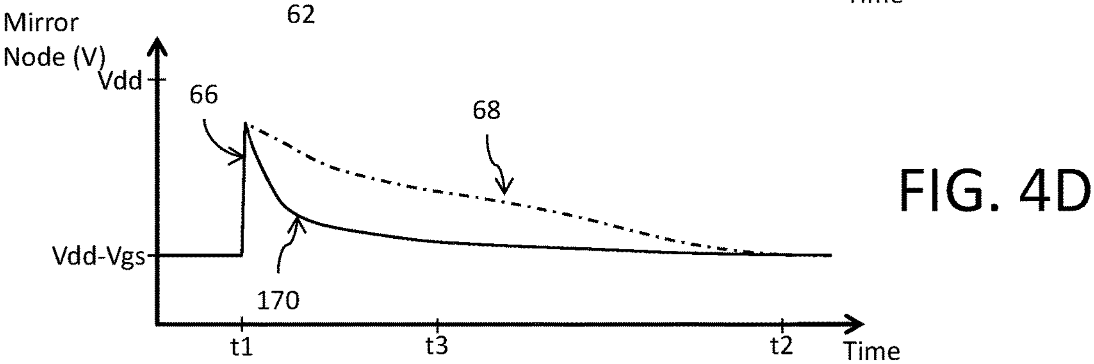
Figure 4E:
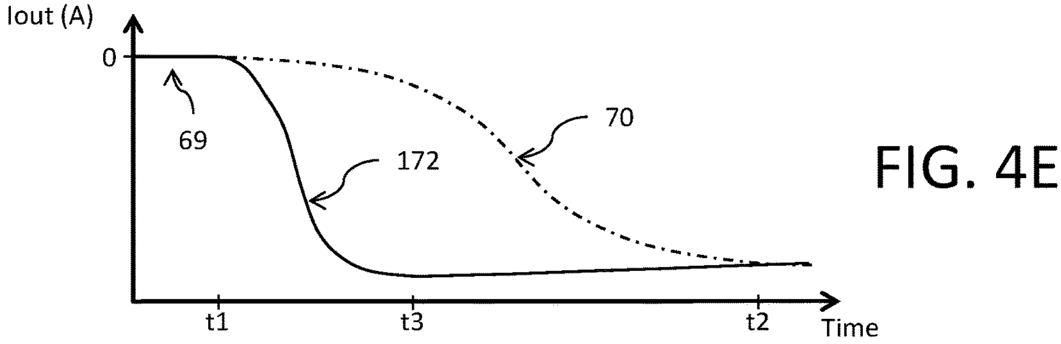

Because of charge sharing, the voltage at the gate (mirror) node of transistors 14 and 114 will immediately rise (reference 66). As a result, the gate to source voltage (Vgs) of transistor 114 is decreased causing a reduction in the copy current Icpy flowing in the copy leg 112. At the same time, however, the gate to source voltage (Vgs) of source-follower transistor 140 is increased as the gate voltage Vg of transistor 140 falls (reference 166) and there is a corresponding increase in the magnitude of the response current Irsp (reference 168). This causes a faster discharge of the voltage at the gate (mirror) node of transistors 14 and 114 (reference 170) toward the pre-time t1 voltage. FIG. 4D illustrates the difference in discharge rate in comparison to the circuit of FIG. 1 (reference 66). As the voltage at the gate (mirror) node of transistor 14 falls, the transistors 28 in the output legs 26(1)-26(*n*) become more conductive and the magnitude of the output current Iout in the output legs 26(1)-26(*n*) correspondingly increases (reference 172). FIG. 4E illustrates the difference in output current magnitude in comparison to the circuit of FIG. 1 (reference 70). The increase in the magnitude of the response current Irsp effectively speeds up the transient operating condition of the gate (mirror) node of transistors 14 and 114.

It will be noted that the delay between time t1 and time t3 when the peak magnitude of the output current Iout is reached is much shorter than the delay between time t1 and time t2 with the circuit of FIG. 1. This shorter "settling time" for the gate (mirror) node voltage between t1 and t3 provides for improved performance in terms of the generation of a current pulse whose leading edge will exhibit a short and sharp transition profile. This is particularly useful, for example, in connection with the generation of a reset pulse for application to PCM cells 80. It will be noted that in connection with the use of the current mirror circuit 110 in such a memory application, a column decoding circuit (DEC) may be included in each of the input leg 12 and the copy leg 112.

With the decrease in the voltage at the gate (mirror) node of transistors 14 and 114, the magnitude of the copy current Icpy flowing in the copy leg 112 increases and the gate to source voltage Vgs of the source-follower transistor 140 begins to collapse. At time t4, the copy current Icpy equals the control current Ictrl and the gate to source voltage Vgs of the source-follower transistor 140 is no longer sufficient to keep the source-follower transistor 140 turned on. The response current Irsp magnitude accordingly falls to zero.

Management of the transient response during the time period between time t4 and time t3 is, in one embodiment, controlled by controlling the magnitude of the input current Iin. To support this operation, a digital to analog converter (DAC) circuit 200 may be provided to generate a current control signal (CC) that sets the magnitude of the input current Iin. The DAC circuit 200 may further function in generating the current control signal (CC) to control the current pulse that is mirrored over to the output currents Iout(1)-Iout(n).

Figure 5A:
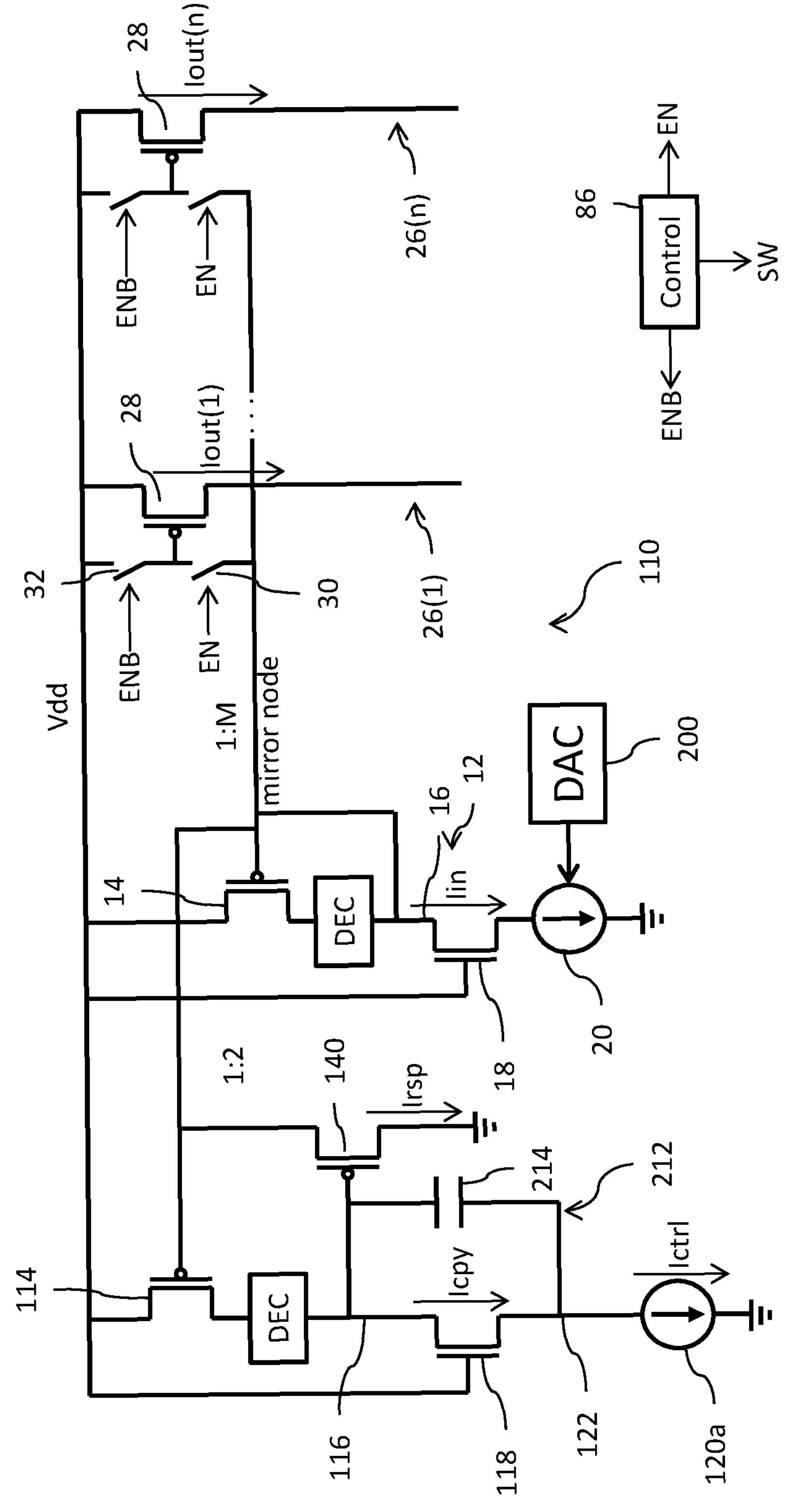
FIGS. 5A-5B are circuit diagrams of a current mirroring circuit.
Figure 5B:
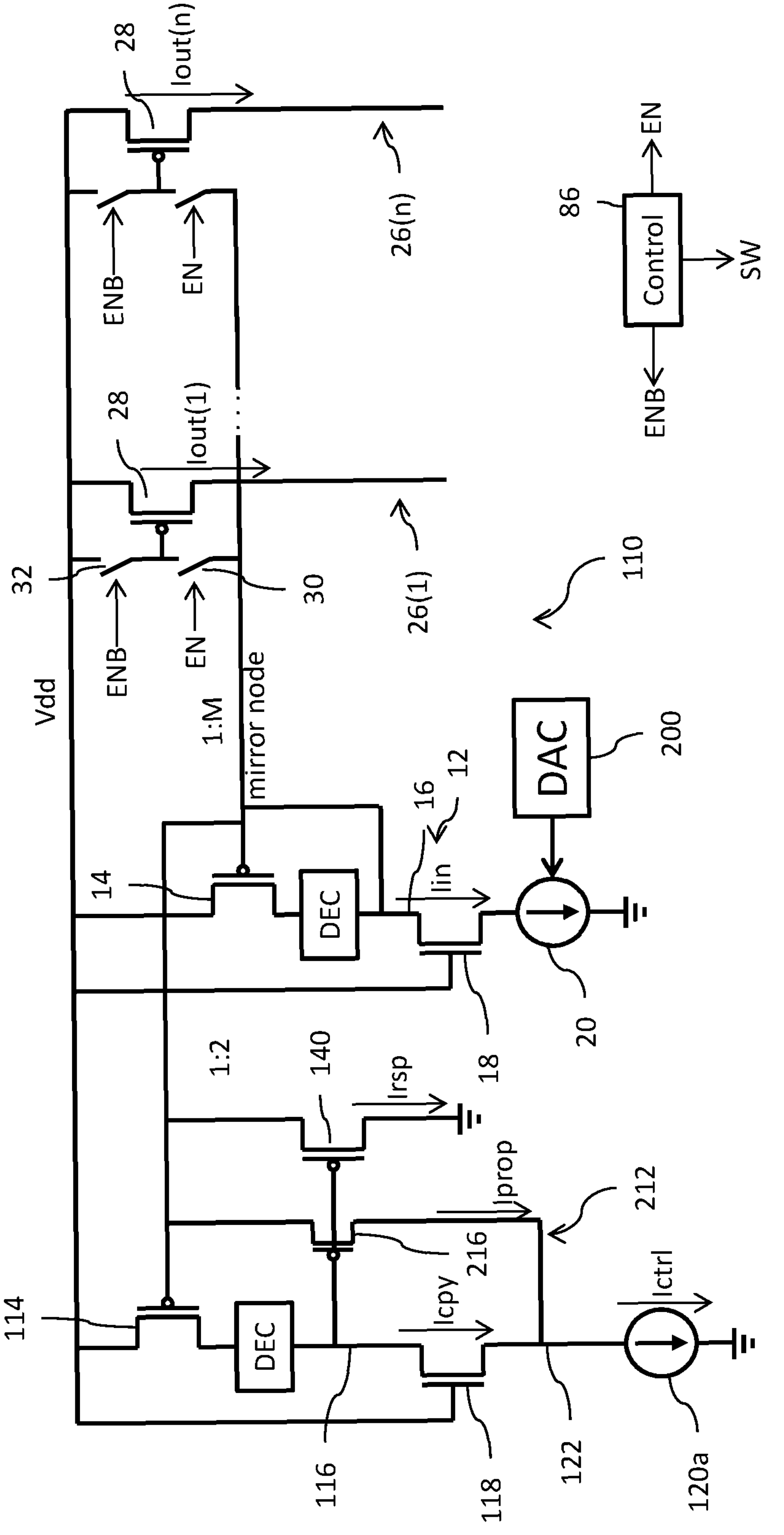

Reference is now made to FIGS. 5A and 5B showing circuit diagrams of a current mirroring circuit 210. Like reference numbers refer to like or similar components which will not be further described. See, discussion of FIG. 3 above.

The circuit 210 differs from the circuit 110 of FIG. 3 in the following way: The switched polarization current source 120*b* has been removed and replaced with an analog current feedback circuit 212. In one embodiment of the current feedback circuit 212 shown in FIG. 5A, a capacitor 214 includes a first terminal coupled to the gate node of source-follower transistor 140 and a second terminal coupled the intermediate node 122. In another embodiment of the current feedback circuit 212 shown in FIG. 5B, a transistor 216 generates a current Iprop that is proportional to the response current Irsp and injects that current into the intermediate node 122. The transistor 216 shares a common gate and source node with transistor 140, and has a drain node coupled to the intermediate node 122. The copy leg 112 may also include, as shown in FIGS. 5A-5B, the column decoding circuit (DEC).

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method, comprising:

mirroring an input current in an input circuit leg to an output current in an output circuit leg;

selectively actuating the output circuit leg;

prior to said selectively actuating, generating a copy current in a copy circuit leg that is mirrored with the input current in the input circuit leg; and after selectively actuating, responding to a decrease in magnitude of the copy current due to charge sharing at a common mirror node of the input circuit leg, output circuit leg and copy circuit leg by generating a response current which discharges said common mirror node.

2. The method of claim 1, wherein generating the copy current comprises:

generating the copy current with a first current magnitude prior to said selectively actuating; and generating the copy current with a second current magnitude, less than the first current magnitude, after selectively actuating.

3. The method of claim 1, wherein generating the response current which discharges said common mirror node comprises sinking said response current from the common mirror node through a circuit leg different from the input circuit leg, output circuit leg and copy circuit leg.

4. The method of claim 1, wherein selectively actuating comprises selectively connecting a control terminal of an output mirror transistor of the output circuit leg to the common mirror node.

5. The method of claim 4, further comprising, prior to selectively actuating, pre-charging the control terminal of the output mirror transistor, and wherein said charge sharing comprises sharing of said pre-charging at the control terminal of the output mirror transistor.

6. The method of claim 1, wherein the common mirror node is at a control terminal of an input mirror transistor of the input circuit leg.

7. The method of claim 1, wherein the copy current is a fraction of the input current.

8. The method of claim 1, further comprising: connecting the input circuit leg to a source of the input current in response to a decoding operation.

9. The method of claim 1, further comprising: connecting the output circuit leg to a memory circuit in response to a decoding operation.

10. The method of claim 1, wherein generating the response current which discharges said common mirror node comprises actuating a source-follower transistor connected to the common mirror node to sink the response current from the common mirror node.

* * * * *